(12) United States Patent
Nakamura et al.

(10) Patent No.: US 7,919,394 B2
(45) Date of Patent: Apr. 5, 2011

(54) METHOD FOR THINNING SUBSTRATE AND METHOD FOR MANUFACTURING CIRCUIT DEVICE

(75) Inventors: Akihiko Nakamura, Kanagawa (JP);
Atsushi Miyanari, Kanagawa (JP);
Yoshihiro Inao, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 1167 days.

(21) Appl. No.: 11/517,157

(22) Filed: Sep. 7, 2006

(65) Prior Publication Data

US 2007/0054470 A1    Mar. 8, 2007

(30) Foreign Application Priority Data

Sep. 8, 2005  (JP) ................................. 2005-260469

(51) Int. Cl.
*H01L 21/30* (2006.01)
*H01L 21/46* (2006.01)

(52) U.S. Cl. ........ 438/459; 438/458; 438/464; 438/691; 438/692

(58) Field of Classification Search .................. 438/458, 438/459, 464, 691–692
See application file for complete search history.

(56) References Cited

U.S. PATENT DOCUMENTS

| | | | | |
|---|---|---|---|---|
| 6,492,195 | B2 * | 12/2002 | Nakanishi et al. | 438/106 |
| 6,943,056 | B2 * | 9/2005 | Nemoto | 438/106 |
| 7,052,934 | B2 * | 5/2006 | Kurimoto et al. | 438/106 |
| 7,211,168 | B2 * | 5/2007 | Miyanari | 156/344 |
| 2002/0036077 | A1 * | 3/2002 | Getchel et al. | 165/80.1 |

FOREIGN PATENT DOCUMENTS

JP    2005-150434    6/2005

* cited by examiner

*Primary Examiner* — Kevin M Picardat
*Assistant Examiner* — Bac H Au
(74) *Attorney, Agent, or Firm* — Carrier Blackman & Associates, P.C.; Joseph P. Carrier; William D. Blackman

(57) ABSTRACT

A method for thinning a substrate and a method for manufacturing a circuit device which make it possible to prevent the pattern of penetrating holes of a supporting plate from being transferred to the surface of the substrate and prevent non-uniform grinding of the surface of the substrate from occurring. The supporting plate and the substrate are joined by using an adhesive layer, and a sheet is attached to the supporting plate. The surface of the supporting plate to which the sheet has been attached is mounted and fixed by attraction onto an attracting head. The surface of the semiconductor wafer on which no circuit device is formed is ground by a grinder in this state.

12 Claims, 4 Drawing Sheets

METHOD FOR THINNING SUBSTRATE AND METHOD FOR MANUFACTURING CIRCUIT DEVICE

BACKGROUND OF THE INVENTION

1. Field of the Invention

The present invention relates to a method for thinning a substrate such as a semiconductor wafer, and a method for manufacturing a circuit device.

2. Description of the Prior Art

There is a need to make IC cards or cell phones thinner, smaller, and lighter. In order to satisfy this need, a semiconductor chip to be incorporated therein must be thin. Although the thickness of a wafer which forms a semiconductor chip is 125-150 µm at present, it is expected that the thickness of a semiconductor wafer must be 25-50 µm for a next generation chip.

An example of a conventional method for thinning a semiconductor wafer has been disclosed in Document 1. According to this method, a supporting plate made of a rigid material such as glass, ceramic, or metal is attached to a surface of a semiconductor wafer on which a circuit device has been formed, so that the supporting plate and the semiconductor wafer are united. The supporting plate in this united state is fixed to an attracting head, and the rear surface of the semiconductor wafer is ground by a grinder to thin the wafer.

[Document 1] Japanese Patent Application Publication No. 2005-150434

In the method disclosed in Document 1, the supporting plate needs to be stripped from the thinned semiconductor wafer before the subsequent dicing step. However, since the supporting plate and the semiconductor wader are bonded to each other with no gap by using an adhesive, it is difficult to strip.

Thus, the present inventors have proposed a supporting plate provided with a plurality of penetrating holes through which solvent can flow to the adhesive.

In order to thin (grind) a substrate by using this supporting plate, after a layered structure is formed by attaching the supporting plate to a surface of a semiconductor wafer W (on which a circuit device has been formed), the supporting plate side of the layered structure is mounted and fixed onto an attracting head as shown in FIG. 6. The other surface of the semiconductor wafer (the reverse or opposite surface of the surface on which a circuit device has been formed) is ground by a grinder in this state.

However, in this method for thinning a substrate, since attraction (vacuum attraction) is performed throughout grinding, the pressure inside the penetrating holes is reduced by negative pressure at the time of vacuum attraction. Consequently, there are cases where the pattern of the penetrating holes is transferred to the surface of the thinned semiconductor wafer W on which a circuit device has been formed through the adhesive layer.

There are also cases where the semiconductor wafer W is drawn to the attracting head side through the supporting plate and the adhesive layer by negative pressure at the time of vacuum attraction when the other surface of the semiconductor wafer W is ground by a grinder.

In this instance, since the wafer W is spaced apart from the grinder, some problems might arise such as non-uniform grinding of the other surface of the semiconductor wafer W or an increase in the surface roughness. If another circuit device is formed in the other surface of the semiconductor wafer W, these problems might affect the properties of such a circuit device.

In order to solve the above-mentioned drawbacks, an object of the present invention is to provide a method for thinning a substrate and a method for manufacturing a circuit device which make it possible to prevent the pattern of penetrating holes from being transferred to the substrate and prevent problems such as non-uniform grinding of the surface of the substrate from occurring.

SUMMARY OF THE INVENTION

According to the present invention, there is provided a method for thinning a substrate using a supporting plate which has a number of penetrating holes, comprising the steps of forming a layered structure by attaching a surface of the supporting plate to a circuit-formed surface of the substrate, attaching a sheet to the other surface of the supporting plate of the layered structure, and grinding the surface opposite to the circuit-formed surface of the substrate in a state where the layered structure is fixed to the sheet.

Since the method for thinning a substrate according to the present invention comprises the steps of forming a layered structure by attaching a surface of the supporting plate to a circuit-formed surface of the substrate, attaching a sheet to the other surface of the supporting plate of the layered structure, and grinding the surface opposite to the circuit-formed surface of the substrate in a state where the layered structure is fixed to the sheet, when the surface opposite to the circuit-formed surface of the substrate is ground in a state where the layered structure is fixed to the sheet, for example, to an attracting head by vacuum attraction, it is possible to prevent the pressure inside the penetrating holes from being reduced by interrupting negative pressure at the time of vacuum attraction due to the sheet which has been attached to the other surface of the supporting plate before the grinding step. With this, it is possible to prevent the pattern of the penetrating holes from being transferred to the circuit-formed surface of the substrate.

It is also possible to prevent the substrate from being drawn, for example, to the attracting head by interrupting negative pressure at the time of vacuum attraction due to the sheet. Consequently, it is possible to prevent non-uniform grinding of the surface of the substrate from occurring.

According to the present invention, there is also provided a method for manufacturing a circuit device using the above-mentioned method for thinning a substrate, comprising the steps of stripping the sheet subsequent to the step of grinding the surface opposite to the circuit-formed surface of the substrate, attaching a dicing tape to the surface opposite to the circuit-formed surface of the substrate, dissolving an adhesive layer interposed between the supporting plate and the circuit-formed surface of the substrate by using a solvent, and stripping the supporting plate from the substrate.

Since the method for manufacturing a circuit device according to the present invention comprises the steps of stripping the sheet subsequent to the step of grinding the surface opposite to the circuit-formed surface of the substrate, attaching a dicing tape to the surface opposite to the circuit-formed surface of the substrate, dissolving an adhesive layer interposed between the supporting plate and the circuit-formed surface of the substrate by using a solvent, and stripping the supporting plate from the substrate, it is possible to obtain a circuit device without affecting its properties by cutting the substrate after the supporting plate is stripped from the substrate.

According to the present invention, there is also provided a method for manufacturing a circuit device using the above-mentioned method for thinning a substrate, comprising the steps of attaching a dicing tape to the surface opposite to the circuit-formed surface of the substrate subsequent to the step of grinding the surface opposite to the circuit-formed surface of the substrate, stripping the sheet, dissolving an adhesive layer interposed between the supporting plate and the circuit-formed surface of the substrate by using a solvent, and stripping the supporting plate from the substrate.

Since the method for manufacturing a circuit device according to the present invention comprises the steps of attaching a dicing tape to the surface opposite to the circuit-formed surface of the substrate subsequent to the step of grinding the surface opposite to the circuit-formed surface of the substrate, stripping the sheet, dissolving an adhesive layer interposed between the supporting plate and the circuit-formed surface of the substrate by using a solvent, and stripping the supporting plate from the substrate, it is possible to obtain a circuit device without affecting its properties by cutting the substrate after the supporting plate is stripped from the substrate.

DETAILED DESCRIPTION OF THE PREFERRED EMBODIMENTS

Figure 1:
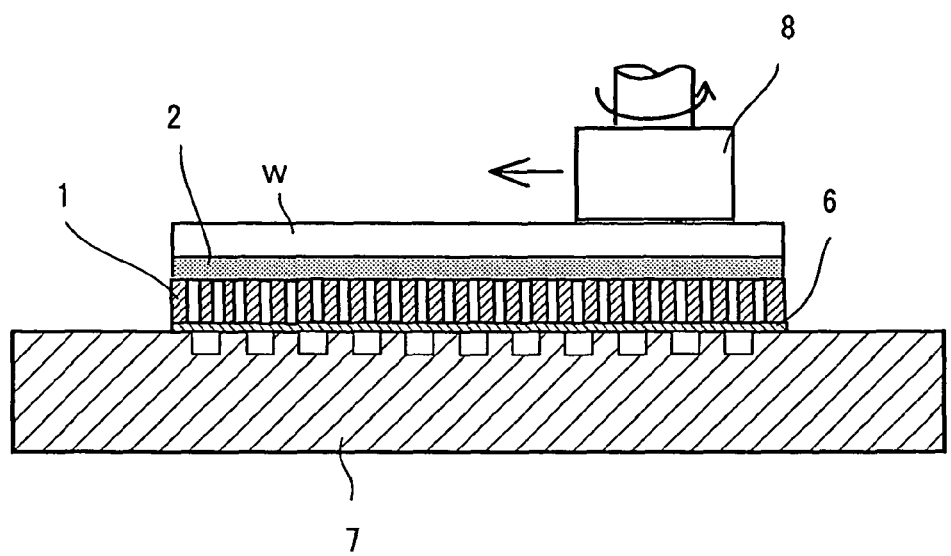
FIG. 1 is a cross-sectional view showing an embodiment of a method for thinning a wafer according to the present invention.

Embodiments of the present invention will be described below with reference to the attached drawings. FIG. 1 is a schematic cross-sectional view showing an embodiment of a method for thinning a wafer according to the present invention, FIG. 2 is a perspective view of a supporting plate, and FIG. 3 is a cross-sectional view of the supporting plate.

Incidentally, FIG. 1 shows a state where a sheet has already been attached to the other surface of the supporting plate.

The supporting plate 1 is made of glass, ceramic or metal. A surface of the supporting plate 1 and a circuit-formed surface of a substrate (semiconductor wafer W) are bonded to each other with an adhesive layer 2.

Figure 2:
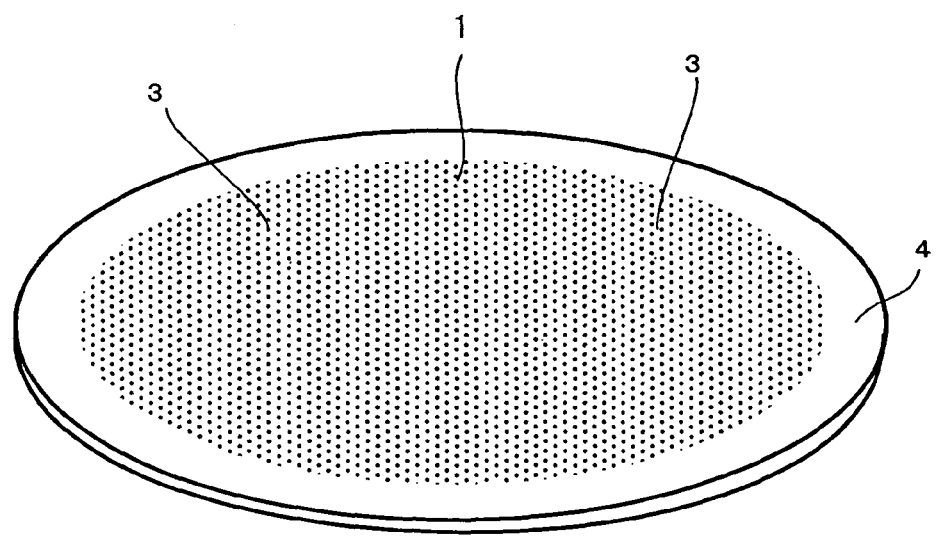
FIG. 2 is a perspective view of a supporting plate.
Figure 3:
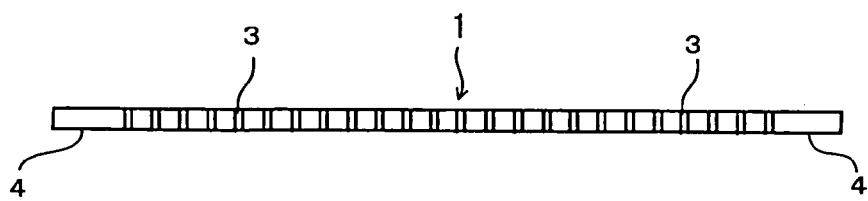
FIG. 3 is a cross-sectional view of the supporting plate.

A number of penetrating solvent flow holes 3 are formed in the thickness direction of the supporting plate 1 as shown in FIGS. 2 and 3. The outer periphery of the supporting plate 1 is a flat portion 4 where no penetrating holes are formed.

The number and the position of the penetrating holes 3 are not limited, and various embodiments are possible.

An alcohol-based solvent or an alkali-based solvent can be used.

In the supporting plate 1 shown in FIGS. 1 to 3, the outer periphery is a flat portion 4 where no penetrating holes are formed. However, it is also possible to use a supporting plate in which penetrating holes 3 are formed over the whole surface including the outer periphery.

Preferably, a sheet 6 attached to the other surface of the supporting plate 1 is made of a material which has properties such as resistance to the heat generated at the time of the thinning of a substrate and resistance to the solvent. More preferably, the material of the sheet 6 has properties of adhering to and being easily stripped from the supporting plate 1.

The sheet 6 having the above-mentioned properties could be a sheet of a resin such as polyimide which is used in the present embodiment.

Next, an embodiment of a method for thinning a substrate using the above-described supporting plate 1 will be explained.

A layered structure is formed by attaching a surface of the supporting plate 1 to a circuit-formed surface of the semiconductor wafer W with the adhesive layer 2.

The sheet 6 is attached to the other surface of the supporting plate 1 of the layered structure.

The surface of the supporting plate 1 to which the sheet 6 has been attached is mounted and fixed by attraction to an attracting head 7. The surface of the semiconductor wafer W on which no circuit device is formed is ground by a grinder 8 in this state. The semiconductor wafer W is thinned in this way.

In this embodiment, since the sheet 6 is attached between the attracting head 7 and the supporting plate 1, even if attraction is performed throughout grinding, it is possible to block negative pressure with the sheet 6 so as to prevent the pressure inside the penetrating holes 3 from being reduced by the attracting head 7. Consequently, it is possible to prevent the pattern of the penetrating holes 3 from being transferred to the thinned semiconductor wafer W.

Also, since the negative pressure can be blocked or reduced by the sheet 6, it is possible to prevent the semiconductor wafer W from being drawn so as to prevent non-uniformity in grinding from occurring.

Further, grinding is performed while a treatment liquid (for example, water) is supplied. With the provision of the sheet 6, it is possible to prevent water from entering the penetrating holes 3 from between the attracting head 7 and the supporting plate 1, for example. With this, it is possible to prevent the supporting plate 1 from stripping from the semiconductor wafer W. It is also possible to greatly reduce the time required for drying the supporting plate 1 in a case where the supporting plate 1 is reused.

Furthermore, with the provision of sheet 6 it is possible to prevent grinding dust from entering the penetrating holes 3.

Since the sheet 6 has excellent chemical resistance, it is also possible to prevent the supporting plate 1 from being damaged.

Next, a process for stripping the supporting plate 1 after thinning the semiconductor wafer W will be explained.

Figure 4:
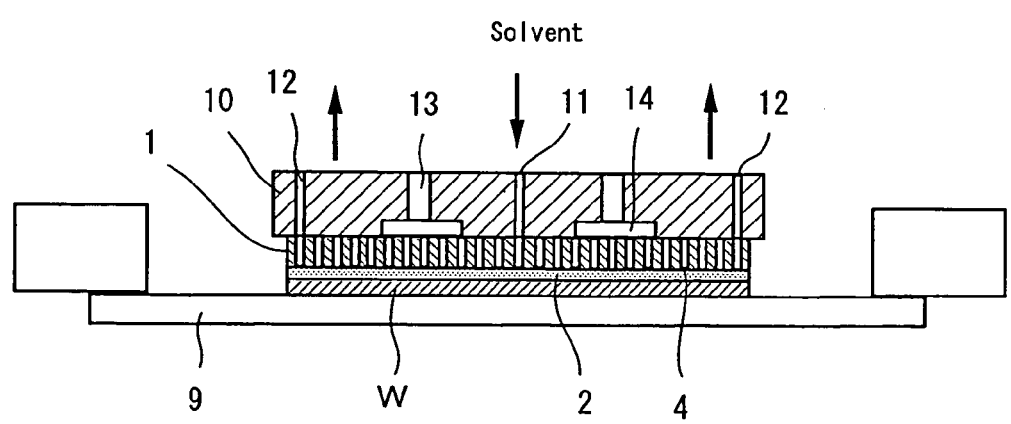
FIG. 4 is a cross-sectional view showing a state where a solvent is dissolving the adhesive.

The layered structure in which the thinned semiconductor wafer W and the supporting plate 1 are attached is removed from the attracting head. A dicing tape 9 is attached to the surface of the semiconductor wafer W on which no circuit is formed (i.e., the surface opposite to the circuit-formed surface) as shown in FIG. 4.

The sheet 6 is stripped from the supporting plate 1, and a plate (solvent supplying plate) 10 is pushed onto the other surface of the supporting plate 1.

When a solvent is supplied from a solvent supplying hole 11 of the plate 10 in this state, the solvent is distributed over the adhesive layer 2 through the number of penetrating holes 3 of the supporting plate 1 so as to dissolve the adhesive layer 2.

The solvent used for dissolving the adhesive layer 2 is discharged (withdrawn) from a solvent discharging hole 12 of the plate 10.

Next, the supporting plate 1 is gripped and lifted up with an arm having a clamp shape, for example, in order to strip the supporting plate 1 from the semiconductor wafer W.

With this, the semiconductor wafer W is left on the dicing tape 9, and the supporting plate 1 alone is stripped.

The semiconductor wafer W on the dicing tape 9 is cut along routes with a cutter, and a plurality of circuit devices is obtained.

In order to form circuits (including a through electrode) on both surfaces of the semiconductor wafer W, another circuit is formed in the other surface (which has just undergone grinding) of the semiconductor wafer W in a state where the semiconductor wafer W and the supporting plate 1 are united after thinning the semiconductor wafer W.

In this instance, since non-uniform grinding of the other surface of the semiconductor wafer W is reduced as described above, it is possible to form a circuit device on this surface.

In the above-described embodiment, a resin sheet (polyimide) is used as the sheet 6. However, a reactive tape whose adhesiveness is degraded by a remote cause from outside such as UV radiation or heating, or a pressure sensitive tape which can be attached and stripped, e.g., by peeling, such as a BG (back grind) tape or a dicing tape may be used. As known, an opposite surface of the pressure sensitive tape which engages the vacuum attracting head in non-adhesive.

Although the sheet 6 is used in the above-described embodiment, a protective film may be formed instead of the sheet 6. In this instance, a protective film made of a water-soluble resin liquid or a soluble resin is formed on the other surface of the supporting plate 1.

The protective film can achieve the same function as in the case of the sheet 6.

In the above-described embodiment, the surface of the semiconductor wafer W on which no circuit is formed (i.e., the surface opposite to the circuit-formed surface) is ground by the grinder 8, and after the dicing tape 9 is attached to this surface, the sheet 6 is stripped.

However, this order may be changed. Specifically, the surface of the semiconductor wafer W on which no circuit is formed (i.e., the surface opposite to the circuit-formed surface) is ground by the grinder 8, and after the sheet 6 is stripped, the dicing tape 9 is attached to the surface of the semiconductor wafer W on which no circuit is formed.

In summary, after attaching the dicing tape 9, the sheet 6 may be stripped. Alternatively, after stripping the sheet 6, the dicing tape 9 may be attached.

The same results can be achieved in both cases.

Figure 5:
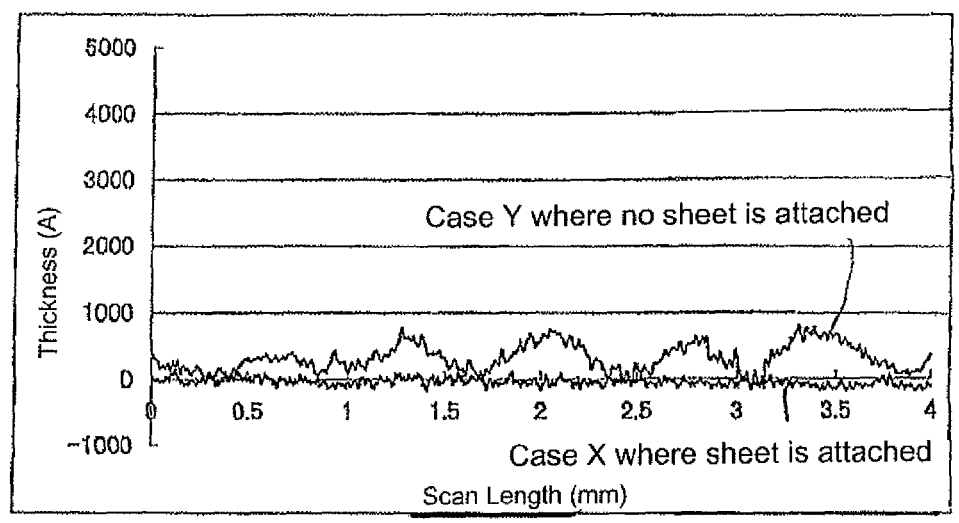
FIG. 5 is a graph showing measured flatness of the ground surface of a substrate in a case where a sheet is attached and a case where no sheet is attached.
Figure 6:
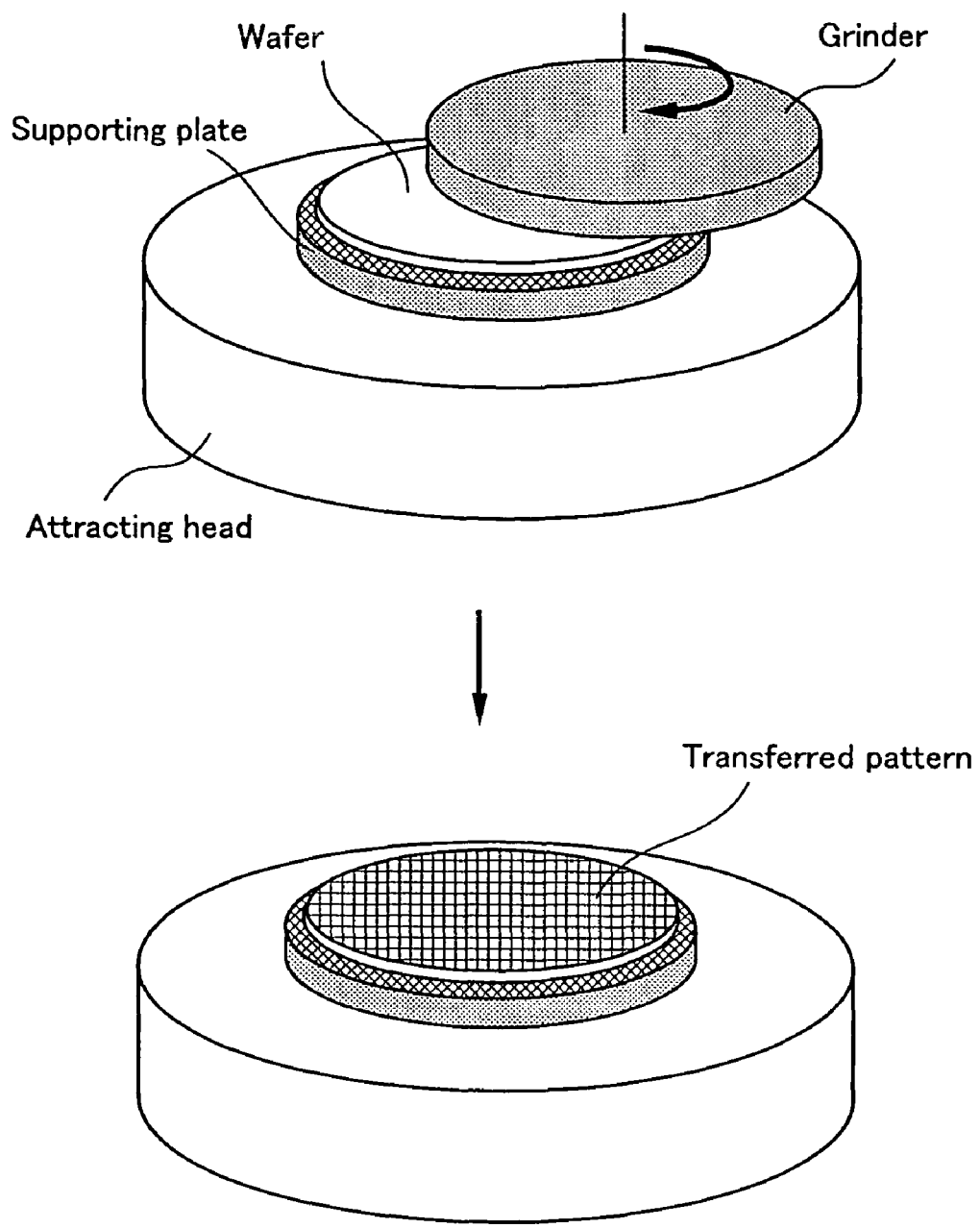
FIG. 6 is a view explaining a drawback of a conventional technique.

FIG. 5 is a graph showing measured flatness of the ground surface of the semiconductor wafer W in a case where the sheet 6 is attached and in a case where no sheet is attached.

In this graph, the measurement is performed on three penetrating holes of the supporting plate.

The case where the sheet 6 is attached is shown as "X", and the case where no sheet is attached is shown as "Y".

FIG. 5 shows that the transfer of the pattern of the penetrating holes 3 can be reduced in the case where the sheet 6 is attached compared to the case where no sheet is attached, so that irregularities can be reduced.

The present invention is not limited to the above-mentioned embodiments, and other various structures are possible within the scope of the present invention.

EFFECT OF THE INVENTION

According to the present invention, it is possible to provide a method for thinning a substrate and a method for manufacturing a circuit device which make it possible to prevent the pattern of penetrating holes from being transferred to the substrate and prevent problems such as non-uniform grinding of the surface of the substrate from occurring.

Consequently, it is possible to manufacture a circuit device having good properties, and improve reliability of the manufacturing process.

What is claimed is:

1. A method for thinning a substrate using a supporting plate which has a number of penetrating holes, comprising the steps of: forming a layered structure by attaching a surface of the supporting plate to a circuit-formed surface of the substrate; attaching a sheet to the other surface of the supporting plate of the layered structure such that the sheet covers all of the penetrating holes; securing the layered structure to a vacuum attracting head such that said sheet directly engages said vacuum attracting head and blocks negative pressure of the vacuum attracting head from the penetrating holes; and grinding the surface opposite to the circuit-formed surface of the substrate in a state where the layered structure is fixed to the sheet, wherein
the sheet is one of a resin sheet, a reactive tape, a pressure sensitive tape, and a dicing tape, and said sheet is easily stripped from said support plate.

2. A method for manufacturing a circuit device using the method for thinning a substrate according to claim 1, comprising the further steps of: stripping the sheet from the other surface of the supporting plate subsequent to the step of grinding the surface opposite to the circuit-formed surface of the substrate; attaching a dicing tape to the surface opposite to the circuit-formed surface of the substrate; dissolving an adhesive layer interposed between the supporting plate and the circuit-formed surface of the substrate by using a solvent; and stripping the supporting plate from the substrate.

3. The method for manufacturing a circuit device according to claim 2, wherein just after the step of grinding the surface opposite to the circuit-formed surface of the substrate, another circuit is formed on the surface opposite to the circuit-formed surface.

4. A method for manufacturing a circuit device using the method for thinning a substrate according to claim 1, comprising the further steps of: attaching a dicing tape to the surface opposite to the circuit-formed surface of the substrate subsequent to the step of grinding the surface opposite to the circuit-formed surface of the substrate; stripping the sheet from the other surface of the supporting plate; dissolving an adhesive layer interposed between the supporting plate and the circuit-formed surface of the substrate by using a solvent; and stripping the supporting plate from the substrate.

5. The method for manufacturing a circuit device according to claim 4, wherein just after the step of grinding the surface opposite to the circuit-formed surface of the substrate, another circuit is formed on the surface opposite to the circuit-formed surface.

6. The method for thinning a substrate according to claim 1, wherein the sheet is a polyimide resin sheet.

7. The method for thinning a substrate according to claim 1, comprising the further step of stripping the sheet from the other surface of the supporting plate by peeling subsequent to the grinding step.

8. The method for thinning a substrate according to claim 1, wherein a non-adhesive surface of the sheet is engaged by said vacuum attracting head.

9. A method for thinning a substrate using a supporting plate which has a number of penetrating holes, comprising the steps of: forming a layered structure by attaching a surface of the supporting plate to a circuit-formed surface of the substrate; forming a protective film of a soluble resin the other surface of the supporting plate of the layered structure such that the protective film covers all of the penetrating holes; securing the layered structure to a vacuum attracting head such that said protective film directly engages said vacuum attracting head and blocks negative pressure of the vacuum attracting head from the penetrating holes; and grinding the surface opposite to the circuit-formed surface of the substrate in a state where the layered structure is fixed to the protective film, wherein said protective film is easily stripped from said support plate by being dissolved using a solvent.

10. The method for thinning a substrate according to claim 9, wherein the protective film is one of a water-soluble resin liquid and a soluble resin.

11. A method for manufacturing a circuit device using the method for thinning a substrate according to claim 9, comprising the further steps of: stripping the protective film from the other surface of the supporting plate subsequent to the step of grinding the surface opposite to the circuit-formed surface of the substrate; attaching a dicing tape to the surface opposite to the circuit-formed surface of the substrate; dissolving an adhesive layer interposed between the supporting plate and the circuit-formed surface of the substrate by using a solvent; and stripping the supporting plate from the substrate, wherein either of said stripping step and said dicing tape attaching step may be performed before the other.

12. The method for manufacturing a circuit device according to claim 11, wherein just after the step of grinding the surface opposite to the circuit-formed surface of the substrate, another circuit is formed on the surface opposite to the circuit-formed surface.

* * * * *